United States Patent [19]

Welty et al.

[11] Patent Number: 4,485,341

[45] Date of Patent: Nov. 27, 1984

[54] CURRENT LIMITER CIRCUIT

[75] Inventors: Dennis L. Welty, Mesa; Don W. Zobel, Tempe, both of Ariz.

[73] Assignee: Motorola, Inc., Schaumburg, Ill.

[21] Appl. No.: 402,496

[22] Filed: Jul. 28, 1982
(Under 37 CFR 1.47)

[51] Int. Cl.³ .......................... H04B 1/58; G05F 3/20
[52] U.S. Cl. ............................. 323/315; 179/170 NC; 179/170 T
[58] Field of Search ........ 179/170 NC, 170 R, 170 T; 323/312, 315, 316, 317; 330/257, 288

[56] References Cited

U.S. PATENT DOCUMENTS 3,849,609 11/1974 Voorman .................... 179/170 T X
3,932,768 1/1976 Takahashi et al. ............. 323/315 X
4,268,789 5/1981 Nagano .............................. 323/315
4,300,023 11/1981 Kelley et al. ................ 179/170 NC
4,314,196 2/1982 Brown ................................ 323/315

Primary Examiner—Peter S. Wong
Attorney, Agent, or Firm—Michael D. Bingham

[57] ABSTRACT

A circuit for limiting the magnitude of current sourced from a first load circuit to a second load circuit to a predetermined value. The circuit includes a current sourcing circuit for sourcing current from the first load circuit to the second and a feedback circuit which is responsive to the magnitude of the current sourced to the second load circuit reaching the predetermined value for supplying any additional current that the second load circuit may require while inhibiting additional current from being sourced from the first load circuit.

13 Claims, 3 Drawing Figures

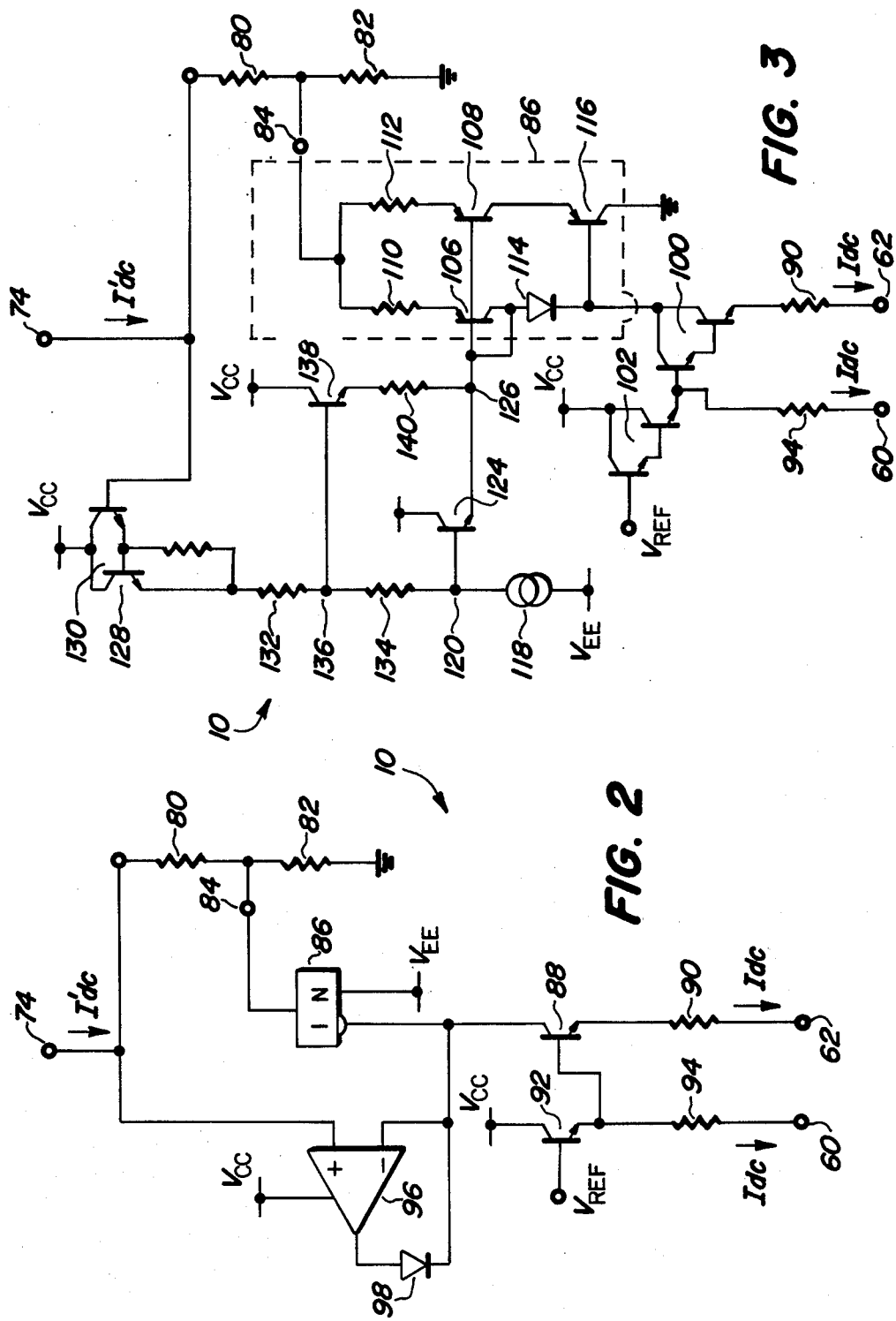

4,485,341

CURRENT LIMITER CIRCUIT

BACKGROUND OF THE INVENTION

The present invention relates generally to current limiting circuits and, more particularly, to a current limiter suitable for use with a Subscriber Loop Interface Circuit (SLIC) or the like for limiting current flow. In particular, the current limiter of the subject invention is utilized in combination with a SLIC to limit the subscriber loop current to a maximum, predetermined value.

Hybrid circuits, or SLICs, which are well known, provide signal conversion between a balanced two-wire bidirectional transmission path and a pair of unbalanced, unidirectional signal paths. SLICs are typically employed in telephony systems to provide signal interface between a telephone carrier channel having unidirectional transmission and receive signal paths to a balanced subscriber loop comprising a telephone instrument. Such SLICs or hybrid circuits have been disclosed and patented. For instance, U.S. Pat. Nos. 3,849,609 and 4,300,023 describe SLICs which are suited for manufacture in monolithic integrated circuit form. These prior art SLICs provide the desired interface between the telephone carrier equipment and the subscriber telephone handset while replacing bulky hybrid transformers.

A typical integrated SLIC circuit must provide both DC and AC impedance matching to the subscriber loop termination. Generally, impedance matching is established in a SLIC by using negative feedback wherein a pair of sensing resistors, having quite large resistance values, are made to appear much smaller. U.S. Pat. No. 4,300,023, mentioned above, describes a method of feedback utilized to perform this impedance matching.

SLICs are powered at the Central Office Exchange by a bank of batteries that supply an operating potential of $-48$ volts. In order to conserve battery power, while also reducing the power consumption in the SLIC, it is desirable to limit the maximum subscriber loop current supplied by the SLIC to a maximum value consistent with the operating requirements of the telephone handset. A problem arises due to the fact that the loop impedance presented between the SLIC and the telephone can vary between 100 to 1900 ohms depending on the distance the telephone is located from the Central Office. Typically, the loop current may vary from 20 milliamps (a subscriber loop of great distance) to 100 milliamps (a subscriber loop of very short distance).

Hence, a need exists for a SLIC of the type described above which can internally limit the value of the loop current supplied to the subscriber loop to a predetermined maximum value even though the SLIC is to be utilized in subscriber loop links which vary from very short distances to very large distances.

SUMMARY OF THE INVENTION

Accordingly, it is an object of the present invention to provide an improved current limiter.

Another object of the invention is to provide an improved current limiter suitable for use in a SLIC which internally limits the value of the current supplied to a subscriber loop connected to the SLIC to a maximum value.

Still another object of the present invention is to provide a SLIC having internal current limiting for limiting the subscriber loop current supplied therefrom.

A further object of the present invention is to provide a monolithic integrated SLIC having an internal current limiter for limiting the loop current supplied to a subscriber loop to a maximum absolute value while providing soft limiting of such current between a first loop current threshold value and the maximum loop current value.

In accordance with the above and other objects there is provided a current limiter comprising first and second terminals each adapted to be coupled respectfully to first and second load circuits, a first circuit coupled between said first and second terminals for sourcing current to the second load circuit from the first load circuit as required, and a feedback circuit coupled with the first circuit that is responsive to the magnitude of current sourced to the second load circuit reaching a predetermined threshold value for supplying additional current as required to the second load while inhibiting further current from being sourced from the first load circuit.

BRIEF DESCRIPTION OF THE DRAWINGS

FIG. 2 is a simplified schematic diagram of the current lismiter illustrated in FIG. 1; and FIG. 3 is a detailed schematic diagram illustrating the current limiter of the preferred embodiment.

DESCRIPTION OF THE PREFERRED EMBODIMENT

Figure 1:
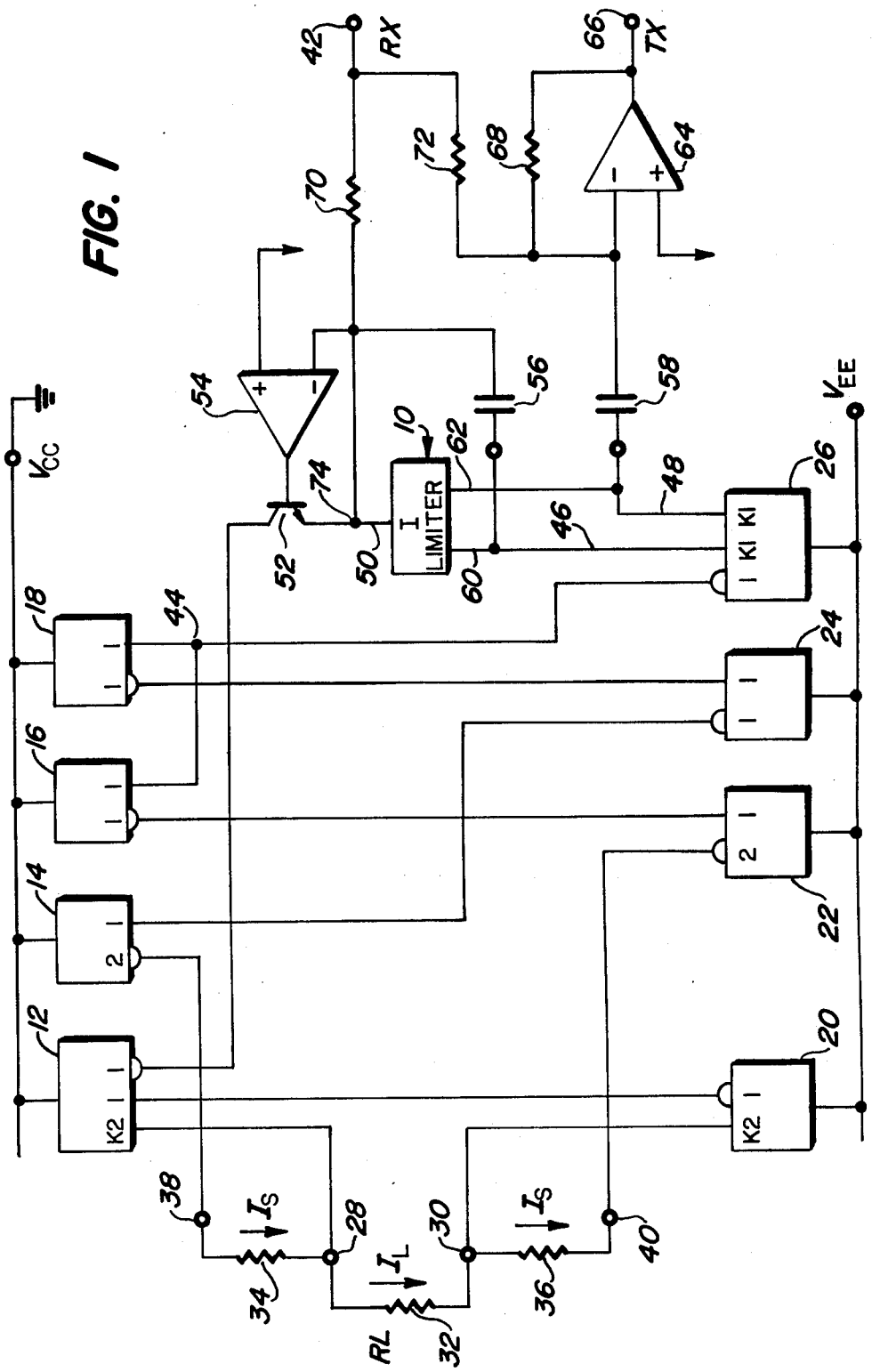
FIG. 1 is a simplified schematic diagram illustrating a SLIC that includes the current limiter of the present invention.

FIG. 1 is a schematic diagram illustrating a SLIC or hybrid circuit that is generally known to those skilled in the art which has been partially modified to include current limiter 10 of the preferred embodiment. The SLIC includes a plurality of current mirrors of complimentary conductivity type. Current mirrors 12, 14, 16, and 18 are of one conductivity type while current mirrors 20, 22, 24, and 26 are of the opposite conductivity type. For example the former may be PNP current mirrors whereas the latter may be NPN current mirrors of the type disclosed in U.S. Pat. No. 4,300,023. The input of each current mirror is indicated by a semi-circle. The outputs of the current mirrors may be current-gain ratioed with respect to the input current such that the value of output current flowing from respective outputs of a particular current mirror may have a different value than the input current thereof. The ratios indicated in FIG. 1 are for illustrative purposes only and may be varied in accordance with the teachings hereof. Thus, for example, the value of the input current of current mirror 14 is indicated as being equal to twice the value of the output current flowing therefrom.

Current mirrors 12, 14, 16, and 18 are adapted to be connected to the positive side, $V_{CC}$, of the battery source supplied at the Central Telephone Exchange Office. Similarly, current mirrors 20, 22, 24, and 26 are adapted to be connected to the negative side, $V_{EE}$, of the battery.

The DC and AC operation characteristics of the SLIC are described in the U.S. Pat. No. 4,300,023 referenced above, the teachings of which are incorporated herein by reference made thereto, and will be briefly described hereinafter. Tip and Ring terminals 28 and 30 are adapted to be coupled to the subscriber loop which has an off-hook impedance, $R_L$, indicated by resistor 32. A pair of sense resistors 34 and 36 are connected in series between Tip and Ring and terminals 38 and 40 for sensing a metallic current that is proportional to the loop current $I_L$. Resistors 34 and 36 are typically much greater in ohmic value than $R_L$, for instance, 90,000 ohms whereas $R_L$ is generally specified to be approximately 900 ohms DC.

DC CHARACTERISTICS

The DC characteristics of the SLIC are now briefly described. Assuming no input signal at the unidirectional receive port, terminal 42, and the telephone handset on hook, terminals 28 and 30 are open. No current can flow through resistors 34 and 36, thus the inputs and outputs of the current mirrors are zero. When, the telephone is taken off-hook, a resistance 32 is connected to terminals 28 and 30 causing a DC current, $I_S$, to flow through resistors 34 and 36. Input current is supplied at the inputs of current mirrors 14 and 22, which is equal to $I_S$ causing output current to flow therefrom of value $I_S/2$. The output current from current mirror 14 flows into the input of current mirror 24 to produce an output current therefrom of equal magnitude $I_S/2$. Likewise, current mirror 22 produces an output current of magnitude $I_S/2$.

The outputs of current mirrors 22 and 24 are coupled respectively to the inputs of current mirrors 16 and 18 to cause currents of magnitude $I_S/2$ to flow from the respective outputs thereof that are then summed at node 44. If the respective output currents from current mirror 16 and 18 are of equal value, a current equal to $I_S$ flows into the input of current mirror 26. Current mirror 26 provides a pair of output currents via leads 46 and 48 each equal to the value $K1I_S$.

As will be described later, only the DC current component of the currents appearing at the outputs of current mirror 26 are supplied to current limiter 10. Under normal operating conditions a current is sourced by current limiter 10 via lead 50 from node 74 through the collector-emitter path of transistor 52. Transistor 52 is biased at its base by operational amplifier 54 such that as the current $I_S$ is sourced through the loop resistance $R_L$, current mirrors 12 and 20 are rendered operative to supply the load current $I_L$. As understood, current mirrors 12 and 20 may include additional gain elements such that the value of $I_L$ is made quite large with respect to $I_S$. Current mirrors 12 and 20 provide feedback wherein the effective resistance value of resistors 34 and 36 is reduced. It can be shown that if the current gain of current mirrors 14, 16, 18, 22, 24 and 26 is equal to K1, and the current gain of current mirrors 12 and 20 is equal to K2, and the current gain of current limiter 10 is K3, the DC feed resistance, $R_f$, appearing at Tip and Ring terminals 28 and 30, is:

$$\frac{R_{34} + R_{36}}{1 + K1K2K3} \quad (1)$$

By varying the gain factors of the current mirrors the effective resistance of resistors 34 and 36 can be reduced, for example to an effective DC loop termination resistance of 400 ohms as is understood.

AC CHARACTERISTICS

The small signal AC characteristics of the SLIC are now described. Assuming first that a balanced signal is supplied at the Tip and Ring terminals from the subscriber telephone, a differential signal is applied thereacross. This differential signal is inputted as two antiphase signals into current mirrors 14 and 22 respectively. These signals are summed at node 44 in-phase to appear at the outputs of current mirror 26 on leads 46 and 48. A RC network is formed by coupling capacitors 56 and 58 at respective terminals 60 and 62 of current limiter 10 such that the AC signals are separated from the DC currents appearing on leads 46 and 48. The AC current on lead 48 is summed at the inverting input of operational amplifier 64 and converted to an AC voltage that is supplied at the 2-wire unidirectional transmit terminal 66. The transmit voltage gain of the SLIC is set by selecting resistor 68 as understood. The AC current on lead 46 is summed at the inverting input of operational amplifier 54 and feeds current mirrors 12 and 20; this determines the AC impedance at terminals 28 and 30.

A receive signal supplied at terminal 42 is transmitted to appear as a differential signal across loop resistance RL at Tip and Ring terminals 28 and 30 as follows. The AC voltage signal at terminal 42 is converted into an AC current through resistor 70 which is connected at the emitter of transistor 52. Transistor 52 provides a low impedance, as seen at terminal 42, such that the majority of the AC current is sourced through the transistor to be multiplied via current mirrors 12 and 20 to differentially drive the loop impedance.

Any portion of the receive signal received at terminal 42 that is transmitted to terminals 28 and 30 that might be reflected back through the SLIC is cancelled at the inverting input of operational amplifier 64 to prevent its transmission at terminal 66. Resistor 72 may be selected to permit a portion of the receive signal appearing at terminal 42 to balance any of the receive signal that might be reflected from the Tip and Ring terminals. Cancellation occurs because these two signals appear at the inverting terminal of operational amplifier 64 out-of-phase with respect to each other. The operation of the SLIC described above is well known to those skilled in the art and is described in great detail in the aforementioned U.S. Pat. No. 4,300,023.

The SLIC described above is typically located at the Central Office Telephone Exchange and is to be connected to a subscriber telephone set via telephone lines. A problem occurs because of the varying line lengths required to connect different SLICs with different subscribers. For instance, the distance between one telephone handset to a respective SLIC may be only a few blocks long, whereas the distance from another telephone handset to its respective SLIC, physically located in the same telephone exchange as the former, may be several miles. Because the total loop resistance RL is a function of the telephone line length to the subscriber, it is common to find that the value of RL may vary from approximately 100 ohms to 1900 ohms DC. Thus, it is not uncommon to have individual loop currents that can vary from a minimum of 20 milliamps to 100 milliamps. Since the telephone handset typically requires only 20 milliamps of DC current to function properly, any excess current results in undesirable power drain on the Central Office Telephone Exchange battery supply. Additionally, this excess current results in an undesirable power consumption in the SLIC. Current limiter 10 of the preferred embodiment is provided to limit the maximum DC current supplied to the subscriber loop to a value of approximately 60 milliamps to accommodate short distance loops while providing a minimum of 20 milliamps loop currents to long distance subscriber loops. In addition, current limiter 10 permits the feed resistance, $R_f$, to be programmed externally to match the SLIC to a particular loop resistance.

Briefly, as long as the value of the DC loop current, $I_L$, is below a first threshold value, for example, 40 milliamps, current limiter 10 will source current from node 74 proportional in magnitude to the current $K1I_S$ as required at the output of current mirror 26. Hence, as long as RL for a particular SLIC (including current limiter 10) remains above a resistance value sufficient to keep the current $K1I_S$ less than the first threshold value, current limiter 10 is not in a current limiting mode. Thus, the DC component of $I_S$ is maintained porportional to $I_L$ as determined by the feedback loop comprising current limiter 10 and current mirrors 12, 14, 16, 18, 20, 22, 24 and 26, and is a function of RL. Thus, $K1I_S$ is substantially equal to the current sourced from node 74 divided by the gain (K3) of current limiter 10.

As the particular value of RL connected to the SLIC produces a load current, $I_L$, that has a value between a first and second threshold, for example, 40-60 ma, current limiter 10 is operated in a soft-limiting mode. In this mode of opration not all of the required current $K1I_S$ is sourced from node 74, rather internal circuitry of current limiter 10 supplies a portion of this total current required by the SLIC to provide the loop current $I_L$.

If the value of $I_L$ causes the magnitude of $K1I_S$ to exceed the second threshold value as mentioned above, current limiter 10 goes into a hard-limiting mode. In this mode, no further current is sourced from node 74 although the magnitude of the DC current $K1I_S$ required may be greater than the current sourced from node 74.

A SLIC incorporating the current limiter of the preferred embodiment is limited to supplying a maximum loop current which cannot be exceeded even though the value of RL may be a minimum value. Hence, as RL may vary from a minimum to a maximum value from one subscriber loop to another, SLICs of the type described above will limit the current supplied to the subscriber loop to a maximum value while also providing a minimum value required to operate the subscriber telephone set.

Turning now to FIG. 2 there is illustrated current limiter 10 of the preferred embodiment. Current limiter 10 is suited to be manufactured in monolithic integrated circuit form and is adapted to be utilized in the SLIC shown in FIG. 1. Briefly, current limiter 10 sources a DC current $I'_{dc}$ from the load means coupled at node 74 to supply a DC current at node 62 to a second load means, which in this particular case is current mirror 26. In practice, the loop sense current $I_S$, as aforedescribed, produces output currents at leads 46 and 48 of current mirror 26 equal to $K1I_S$. The DC components of these currents are supplied at the output 60 and 62, respectively, of current limiter 10.

Current limiter 10 includes serially connected resistors 80 and 82 coupled between node 74 and analog ground. These resistors may be external to current limiter 10 and the SLIC. The interconnection point between resistors 80 and 82 is coupled at node 84 to a common terminal of current mirror 86. The input of current mirror 86 is coupled via the collector-emitter path of transistor 88 and resistor 90 to terminal 62. The output of current mirror 86, which has a current gain ratio equal to N times the input current, is coupled to $V_{EE}$. The base of transistor 88 is coupled to the emitter of transistor 92, whose base is connected to a reference voltage, $V_{REF}$. The collector-emitter path of transistor 92 is coupled between a source of supply and resistor 94 to terminal 60. It is understood that resistors 90 and 94 in conjunction with respective capacitors 56 and 58 separate the DC component of the current $K1I_S$ from the AC component thereof such that the currents, $I_{dc}$, flowing through resistors 90 and 94 have no AC components.

A feedback path comprising operational amplifier 96 and diode 98 is provided which remains inactive as long as current limiter 10 is not in a current limit mode, as will be explained.

Assuming that current limiter 10 is not in a current limiting mode, currents $I_{dc}$ are supplied at outputs 60 and 62 to the respective outputs of current mirror 26 of the SLIC. The current $I_{dc}$ is supplied at the input of current mirror 86 through transistor 88 to appear at output 62 of current limiter 10. Correspondingly, transistor 92 supplies a current $I_{dc}$ at output 60.

As long as current limiter 10 is not in a current limiting mode, all of the current $I_{dc}$ flowing through transistor 88 will be sourced from the input of current mirror 86 while operational amplifier 96 is rendered inactive. Current mirror 86, having a current gain ratio equal to N, causes a current of value $(1+N)$ times the output current to be sourced from node 84 to the common terminal of the current mirror. A current $I'_{dc}$, the value of which may be varied by varying the ratio of external resistors 80 and 82, is sourced from node 74 to be supplied to node 84. Current $I'_{dc}$ when multiplied by the gain factors of current mirrors 12 and 20 and summed with $I_S$ is equal to IL. In this operating state, $K1I_S$ is approximately equal to:

$$K1I_S = I_{dc} = \frac{I'_{dc}}{(I+N)\alpha} = \frac{I'_{dc}}{K3}$$

where $\alpha = \frac{R_{82}}{R_{80} + R_{82}}$

By utilizing external resistors 80 and 82 the ratio of the current $I'_{dc}$ can be varied in direct proportion to the ratio of these two resistors such that the loop feedback signal can be varied. Thus, by adjusting the ratio of these two resistors, the amount of loop feedback can be varied to program the SLIC feed resistance, $R_f$. For example, by increasing or decreasing the value of resistor 82 with respect to resistor 80, the magnitude of $I'_{dc}$ is increased or decreased respectively. This causes the magnitude of $R_f$ to be decreased or increased accordingly.

As the value of $R_L$ presented to a particular SLIC causes the magnitude of the DC component of the current $I_L$ and hence $K1I_S$ to exceed the first threshold value, current limiter 10 operates in a soft-limiting mode wherein only a fractional amount of the increased value of $K1I_S$ ($I_{dc}$) is sourced from node 74. At this first threshold the voltage difference developed across the inverting and noninverting inputs of operational amplifier 96 becomes sufficient to cause the operational amplifier to become active and to forward bias diode 98. As diode 98 is rendered conductive, current is sourced from the positive power supply via diode 98 to the collector of transistor 88 to supply an increasing portion of the current $I_{dc}$. The operation of current limiter 10 can be made such that as the loop resistance RL decreases and the magnitude of $I_L$ and hence $I_{dc}$ is increased between the first threshold value and the second threshold value, the feedback path comprising operation amplifier 96 and diode 98 supplies an increasing proportion of the current $I_{dc}$. Thus, the magnitude of the current $I'_{dc}$ does not increase linearly above the first threshold value, i.e., $K1I_S \neq I'_{dc}/K3$.

Once the value of a particular loop current $I_L$ reaches the second threshold value, current limiter 10 inhibits any further increase in this current even though the loop resistance would otherwise dictate a larger value thereof. In this hard limiting mode, operational amplifier 96 and diode 98 are rendered fully active to supply all of the additional current $I_{dc}$ required and no further additional current is sourced from node 74.

Turning now to FIG. 3, it is to be understood that like components of FIGS. 2 and 3 are designated by the same reference numerals. Transistors 88 and 92 are substituted by respective Darlington connected transistors 100 and 102 respectively. Current mirror 86 includes diode connected transistor 106 and transistor 108 which have their emitter and base electrodes coupled in parallel through respective resistors 110 and 112 to node 84. Transistor 106 and 108 are connected as a known current mirror, with the emitter area of transistor 108 being N times greater than the emitter area of transistor 106. Diode 114 is coupled between the collecter-base of transistor 106 to the input of the current mirror 86 and the base of transistor 116. The emitter of transistor 116 is coupled to the collector of transistor 108 with its collector connected to the output of current mirror 86 to negative supply. Diode 114 and transistor 116 ensure that the collectors of the two transistors 106 and 108 are maintained at the same potential so that the correct current gain ratio is maintained therebetween.

A current source 118 is connected between the negative supply and node 120 to the base of transistor 124 to establish bias thereto. The collector-emitter path of transistor 124 is coupled between the positive power supply and node 126 to the input of current mirror 86. Darlington connected transistors 128 and 130 produce an IR drop through resistors 132 and 134 to establish a first threshold voltage potential at node 136, at the base of transistor 138. The collecter-emitter path of transistor 138 is coupled between positive power supply via resistor 140 to node 126.

As long as the current $I_{dc}$ flowing through Darlington transistor 100 produces a voltage drop at node 126 sufficient to reverse bias transistors 124 and 138, current limiter 10 is in a non-current limiting mode as aforedescribed. However, as the magnitude of $I_{dc}$ reaches a first threshold value, corresponding to a particular value of RL, the voltage level at node 126 will be such to forward bias transistor 138 and current limiter 10 goes into the soft-limiting state. Due to resistor 140, transistor 138 is more or less rendered conductive in a linear fashion as $I'_{dc}$ increases from the first threshold value to supply a portion thereof.

When the second threshold value is reached the voltage potential at node 126 no longer maintains transistor 124 in a reverse bias state. After this point has been reached, transistor 124 is rendered conductive to supply all of the additional current required at the output 62 and $I'_{dc}$ is caused to remain constant. Current limiter 10 is thus in a hard current limiting mode of operation.

What has been described is a current limiter circuit that sources current from a first terminal to a second terminal. When the magnitude of current sourced to the second terminal reaches a first threshold value the current limiter reduces the proportion of current sourced from the first terminal as the current supplied to the second terminal increases to a second threshold value. Thereafter, no additional current is sourced from the first terminal although the current limiter supplies additional current required at the second terminal.

We claim:

1. A current limiter, comprising:
    first and second terminals each adapted to be coupled to respective first and second load utilization means;
    first circuit means coupled between said first and second terminals for sourcing current to said second load utilization means from said first terminal; and
    feedback circuit means responsive to the magnitude of current sourced through said first circuit means reaching a predetermined threshold value for supplying any additional current as required in excess of said predetermined threshold value such that said additional current is not sourced from said first terminal.

2. The current limiter of claim 1 wherein said feedback circuit means is responsive to the magnitude of current sourced to said second load utilization means through said first circuit means reaching a first threshold value for supplying a portion of said required current in excess of said first threshold value until such time that said magnitude of said required current reaches said predetermined threshold value.

3. The current limiter of claim 2 wherein said first circuit means includes a first transistor having first, second and control electrodes, said first electrode being coupled to said second terminal, said second electrode being coupled to said first terminal, said control electrode being adapted to receive a first reference bias potential.

4. The current limiter of claim 3 wherein said first circuit means includes a current mirror circuit having an input, an output and a common terminal, said current mirror having a predetermined current gain ratio between said input and output, said input being coupled to said second electrode of said first transistor, said output being coupled to a third terminal at which is supplied a first operating potential, said common terminal being coupled to said first terminal.

5. The current limiter of claim 4 wherein said first circuit means includes first and second resistors serially connected between said first terminal and an analog ground reference with the interconnection therebetween being coupled to said common terminal of said current mirror circuit.

6. The current limiter of claim 4 or 5 wherein said feedback circuit means includes second circuit means coupled said input of said current mirror circuit for sourcing said any additional current in response to said magnitude of said current sourced to said second utilization load means reaching said predetermined threshold value.

7. The current limiter of claim 6 wherein said feedback circuit means includes third circuit means coupled to said input of said current mirror circuit for sourcing said portion of current.

8. The current limiter of claim 7 wherein:
    said second circuit means includes a second transistor having first, second and control electrodes, said first electrode being coupled to said input of said current mirror circuit, said second electrode being coupled to a fourth terminal at which is supplied a second operating potential, said control electrode being adapted to receive a second reference bias potential; and said third circuit means includes a third transistor having first, second and control electrodes, said second electrode being coupled to said fourth terminal, said control electrode being adapted to receive a third bias potential, and resistive means coupling said first electrode of said third transistor to said input of said current mirror circuit.

9. In a subscriber loop interface circuit adapted to be coupled to a subscriber loop including first circuit means for sensing metallic current flow in the subscriber loop and second circuit means responsive to the metallic current flow for providing a dc loop feed current, a current limiter for limiting the magnitude of the loop feed current to a maximum value, comprising:

first and second terminals respectively coupled to the first and second circuit means;

current mirror means having an input, an output and a common terminal, said input being coupled to said first terminal, said output being coupled to a third terminal at which is supplied a first operating reference potential, said common terminal being coupled to said second terminal, said current mirror sourcing a current that is proportional to the loop feed current from said second terminal to said first terminal; and feedback circuit means responsive to the magnitude of the current sourced to said first terminal reaching a predetermined threshold value for supplying any additional current as required while inhibiting any additional current from being sourced from said second terminal as the magnitude of current sourced to said first terminal exceeds said predetermined threshold value.

10. The current limiter of claim 9 wherein said feedback circuit means is responsive to the magnitude of the current sourced to said first terminal reaching a first threshold value for supplying an increasing portion of such current as the magnitude of such current exceeds said first threshold value such that the portion of such current sourced from said second terminal is increasingly limited.

11. The current limiter of claim 10 including a first transistor having first, second and control electrodes, said first electrode being coupled to said first terminal, said second electrode being coupled to said input of said current mirror means and to said feedback circuit means, said control electrode being adapted to receive a first bias potential.

12. The current limiter of claim 11 wherein said feedback circuit means includes:

a second transistor having first, second and control electrodes, said first electrode of said second transistor being coupled to said second electrode of said first transistor, said second electrode of said second transistor being coupled to a fourth terminal at which is supplied a second operating potential, said control electrode of said second transistor being adapted to receive a second bias potential;

a third transistor having first, second and control electrodes, said second electrode of said third transistor being coupled to said fourth terminal, said control electrode of said third transistor being adapted to receive a third bias potential; and first resistive means coupled between said first electrode of said third transistor and said first electrode of said second transistor.

13. The current limiter of claim 12 including second and third resistive means serially connected between said second terminal and an analog ground reference, the interconnection between said second and third resistive means being coupled to said common terminal of said current mirror means.

* * * * *